United States Patent
Nonaka

(10) Patent No.: US 6,233,529 B1
(45) Date of Patent: May 15, 2001

(54) FREQUENCY SPECTRUM ANALYZER HAVING TIME DOMAIN ANALYSIS FUNCTION

(75) Inventor: Tomoaki Nonaka, Gyoda (JP)

(73) Assignee: Advantest Corp., Tokyo (JP)

( * ) Notice: Subject to any disclaimer, the term of this patent is extended or adjusted under 35 U.S.C. 154(b) by 0 days.

(21) Appl. No.: 09/167,621

(22) Filed: Oct. 6, 1998

(30) Foreign Application Priority Data

Oct. 14, 1997 (JP) .................................................. 9-280424

(51) Int. Cl.⁷ .............................. G01R 23/00; H03L 7/00
(52) U.S. Cl. ........................... 702/76; 702/77; 324/76.19; 324/76.47; 331/17
(58) Field of Search ................... 702/74–77; 324/76.19, 324/76.23, 76.26, 76.47; 455/260, 295, 502; 331/17–18, 44

(56) References Cited

U.S. PATENT DOCUMENTS

| | | | |
|---|---|---|---|
| 4,611,164 | * 9/1986 | Mitsuyoshi et al. | 702/76 |
| 4,839,583 | * 6/1989 | Takano et al. | 702/76 |
| 4,890,099 | * 12/1989 | Takano | 324/76.19 |
| 4,983,906 | * 1/1991 | Hiller | 324/76.47 |
| 5,162,723 | * 11/1992 | Marzalek et al. | 702/77 |
| 5,162,724 | * 11/1992 | Katayama et al. | 702/76 |
| 5,371,760 | * 12/1994 | Allen et al. | 455/67.1 |
| 5,629,649 | * 5/1997 | Ujiie | 331/17 |

* cited by examiner

*Primary Examiner*—Marc S. Hoff
*Assistant Examiner*—Bryan Bui
(74) *Attorney, Agent, or Firm*—Muramatsu & Associates

(57) ABSTRACT

A spectrum analyzer is provided with a continuous period measurement function which continuously measures time periods of each and every cycle of an IF signal to analyze changes in frequency and time period of an input signal in a time domain. The frequency spectrum analyzer having a sweep local oscillator includes a continuous period measurement block for continuously measuring each time period of an IF signal produced by mixing the input signal and the local oscillator signal, and a processor and display for processing the data representing the continuous time period produced by the continuous period measurement block to analyze the input signal in the time domain.

7 Claims, 6 Drawing Sheets

FREQUENCY SPECTRUM ANALYZER HAVING TIME DOMAIN ANALYSIS FUNCTION

FIELD OF THE INVENTION

This invention relates to a frequency spectrum analyzer for analyzing frequency spectrum of an incoming signal in a frequency domain, and more particularly, to a frequency spectrum analyzer having a time domain analysis function in which fast changes in frequency or time period of an incoming signal can be measured in the time domain with high accuracy and high resolution.

BACKGROUND OF THE INVENTION

Frequency spectrum analyzers are widely used for analyzing frequency spectrum of an incoming signal in a frequency domain. Typically in such a frequency spectrum analyzer, levels of frequency spectrum are displayed in a vertical direction with respect to a frequency range in a horizontal direction. A frequency spectrum analyzer may also include a function for displaying levels of the incoming signal in a time domain. A conventional example of such a frequency spectrum analyzer having frequency domain and time domain analysis capabilities is shown in FIG. 6.

The conventional frequency spectrum analyzer of FIG. 6 includes an RF section 10, a detector 20, an AD converter 30, a microprocessor 50, a display 60, and a frequency reference source 70. The RF section 10 is formed of an attenuator 11, an amplifier 12, a frequency mixer 13, a local frequency oscillator 15 and an intermediate frequency (IF) filter 14.

When the frequency spectrum analyzer of FIG. 6 is used for analyzing frequency spectrum of an incoming signal in the frequency domain, the local frequency oscillator 15 linearly sweeps its frequency (sweep mode) for a specified frequency range. When the frequency spectrum analyzer is used for analyzing a time domain waveform of the incoming signal, the local frequency oscillator 15 is set a fixed frequency (zero span mode).

First, the basic operation of the frequency domain analysis is described in the following: An input RF signal provided to an RF terminal is adjusted its power level by the attenuator 11 and the amplifier 12 before being applied to the frequency mixer 13 in such a way that the maximum dynamic range is attained in the measured results. Typically, such a measurement dynamic range is determined by the maximum possible input power level to be applied to the frequency mixer 13 without distortion.

In the example of FIG. 6, the local frequency oscillator 15 generates a local signal whose frequency is swept linearly (sweep mode) with reference to the reference frequency source 70. The RF signal frequency and the local signal frequency are mixed in the frequency mixer 13, thereby creating IF signals having both sum and difference frequencies between the two frequencies. The IF filter 14, which is a band pass filter, selects either one of the sum or difference signals from the frequency mixer 13.

The detector 20 detects an amplitude of the IF signal from the output of the IF filter 14. The AD converter 30 converts the amplitude of the IF signal to a digital signal. The resultant digital signal generated by the AD converter 30 is processed by the microprocessor 50 and is displayed on the display 60 as frequency spectrum with power levels. Typically, the vertical axis of the display 60 represents power levels of the spectrum while the horizontal axis represents frequencies of the spectrum. The microprocessor 50 also controls overall operation of the spectrum analyzer including that of the local oscillator 15, detector 20, display 60 and AD converter 30 via a system bus 80.

Second, the basic operation of the time domain analysis in the frequency spectrum analyzer is described in the following: An input RF signal is provided to the frequency mixer 13 through the attenuator and amplifier in the same manner as in the frequency domain analysis. However, the local frequency oscillator 15 is tuned and fixed to an appropriate frequency (zero span mode) so that an IF signal which has a frequency equal to the center frequency of the band pass filter 14 is produced all the time by the frequency mixer 13. The IF signal from the filter 14 is amplitude detected by the detector 20 and converted to a digital signal by the AD converter 30. Therefore, on the display 60, the power level of the IF signal, which is proportional to the input RF signal, is shown in the time domain.

Thus, in the conventional frequency spectrum analyzer, in the time domain analysis, it is possible to observe and analyze the changes in the power levels of the input RF signal with respect to the elapse of time. However, it is not possible to observe and analyze the changes in the frequency or time period of the input RF signal with respect to the elapse of time. This is because the input RF signal is displayed on the screen in the same manner as displayed by an oscilloscope where a waveform is shown in a format of power level versus time.

Thus, in the zero span mode of the conventional frequency spectrum analyzer, input RF signals whose time period or frequency changes quickly cannot be properly measured in the time domain. For example, settling times in a VCO (voltage controlled oscillator) or PLL (phase lock loop) circuit or a frequency deviation in an FM (frequency modulation) system is not effectively measured by the conventional spectrum analyzer.

SUMMARY OF THE INVENTION

Therefore, it is an object of the present invention to provide a frequency spectrum analyzer which is capable of measuring changes in the period or frequency in an input RF signal in the time domain.

It is another object of the present invention to provide a frequency spectrum analyzer which is capable of measuring small and fast changes in the period or frequency in an input RF signal in the time domain with high speed and accuracy.

It is a further object of the present invention to provide a frequency spectrum analyzer which is capable of measuring settling times in a VCO or PLL circuit or frequency deviation in an FM system in the time domain measurement with high speed and accuracy.

It is a further object of the present invention to provide a frequency spectrum analyzer which is capable of displaying results of time domain analysis with various dimensions and units including time, frequency, power level, data points and number of occurrence.

In the present invention, the spectrum analyzer is provided with a continuous period measurement function which continuously measures time periods of each and every cycle of the IF signal to analyze the changes in frequency and time period of the input signal in the time domain.

The frequency spectrum analyzer of the present invention having a sweep local oscillator is comprised of a continuous period measurement block for continuously measuring each time period of an IF signal produced by mixing the input signal and the local oscillator signal, and means for processing the data representing the continuous time period produced by the continuous period measurement block to analyze the input signal in a time domain.

An example of the continuous period measurement block employed in the frequency spectrum analyzer of the present invention is comprised of a divider for dividing a frequency of the IF signal by a predetermined ratio, a fractional time measurement circuit for measuring a time length of fractional time produced between an edge of the IF signal and a reference clock pulse by expanding the fractional time, a fractional time controller for controlling an operation of measuring the fractional time by the fractional time measurement circuit, a counter for counting the number of reference clock pulse during the time period of the IF signal including the fractional time expanded by the fractional time measurement circuit, a memory for storing data showing the time period obtained by the counter, and an address counter for generating address data for the memory.

According to the present invention, the frequency spectrum analyzer is capable of measuring changes in the period or frequency in an input RF signal in the time domain. The frequency spectrum analyzer can measure small and fast changes in the period or frequency in an input RF signal in the time domain with high speed and accuracy. Accordingly, the frequency spectrum analyzer of the present invention can effectively measure settling times in a VCO or PLL circuit or frequency deviation in an FM system in the time domain measurement with high speed and accuracy. Moreover, the frequency spectrum analyzer of the present invention is capable of displaying results of time domain analysis with various dimensions and units including time, frequency, power level, data points and number of occurrence.

BREIF DESCRIPTION OF THE DRAWINGS

DETAILED DESCRIPTION OF THE PREFERRED EMBODIMENT

Figure 1:
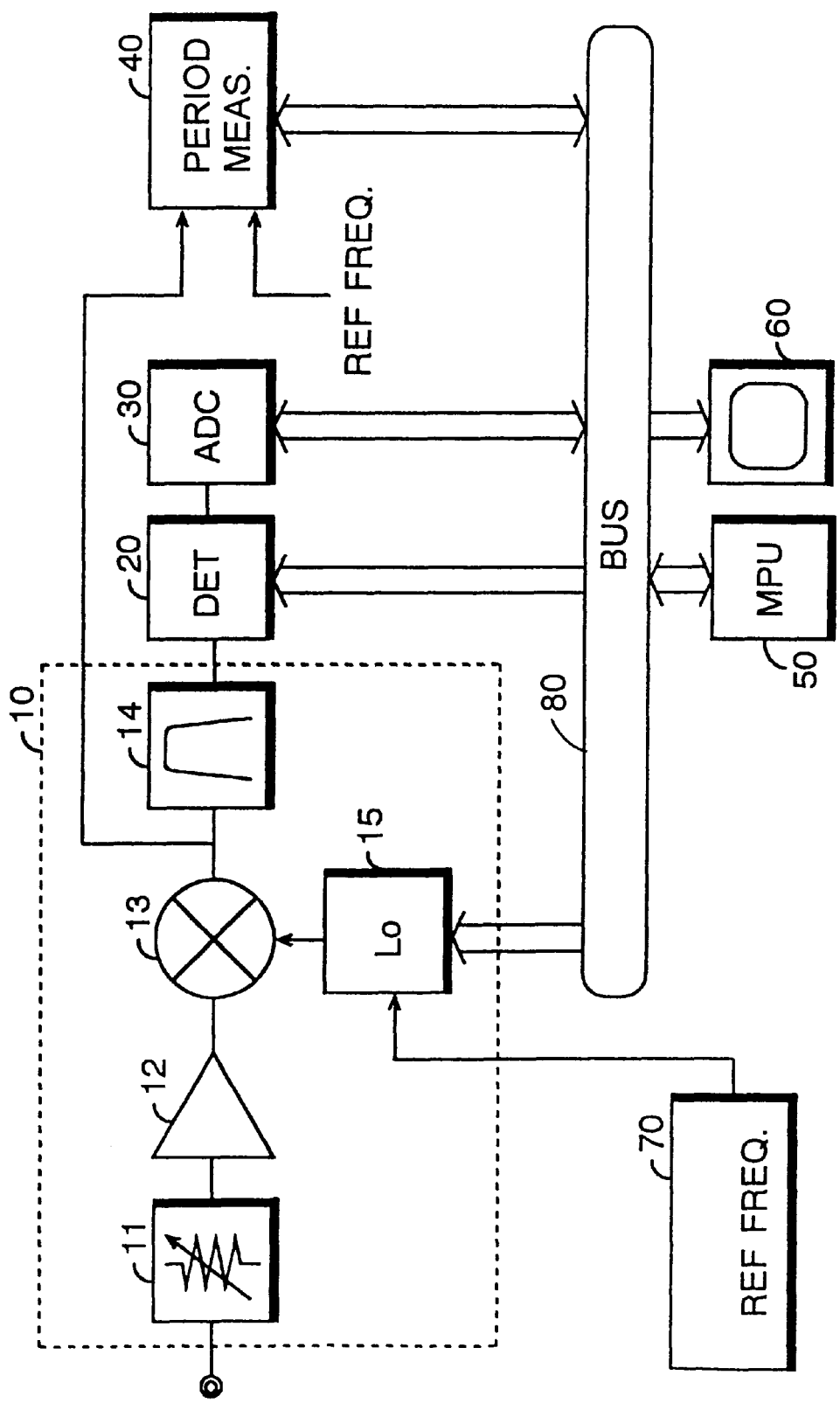
FIG. 1 is a block diagram showing a structure of the frequency spectrum analyzer of the present invention.

The frequency spectrum analyzer of the present invention will be described with reference to FIGS. 1–5. As shown in the block diagram of FIG. 1, the frequency spectrum analyzer of the present invention includes an RF section 10, a detector 20, an AD converter 30, a microprocessor 50, a display 60, a frequency reference source 70 and a continuous period measurement block 40. The RF section 10 includes an attenuator 11, an amplifier 12, a frequency mixer 13, a local frequency oscillator 15 and an intermediate frequency (IF) filter 14. Thus, the difference from the conventional example of FIG. 6 resides in the addition of the continuous period measurement block 40 and its associated operational process controlled by the microprocessor 50.

The continuous period measurement block 40 continuously measures each time period of the IF signal which is taken, for example, from the output of the frequency mixer 13. The continuous period measurement block 40 also calculates frequencies of the IF signal corresponding to the measured time period data. An example of the continuous period measurement block is disclosed in detail in the Japanese Patent Laid-Open Publication No. 9-80091 entitled "Frequency measurement Apparatus", which is briefly described in the following with reference to FIG. 2.

Figure 2:
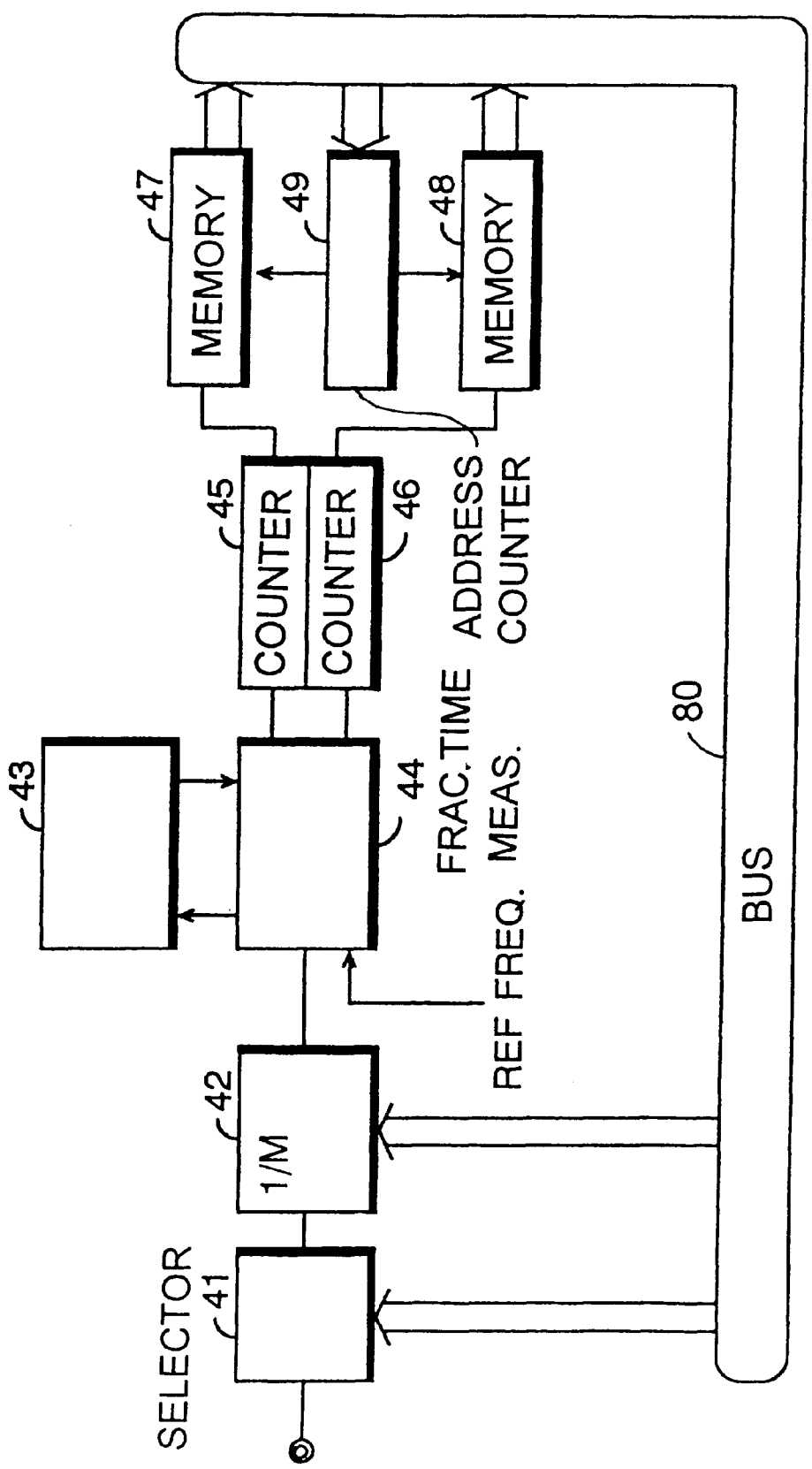
FIG. 2 is a block diagram showing a structure of the continuous period measurement block in the frequency spectrum analyzer of the present invention.

In the example of FIG. 2, the continuous period measurement block 40 includes a selector 41, a divider 42, a fractional time controller 43, a fractional time measurement circuit 44, a first counter 45, a second counter 46, a first memory 47, a second memory 48 and an address counter 49. Each of the components in the continuous period measurement block 40 is connected to the system bus 80 and is controlled by the microprocessor 50.

The selector 41 is to select the IF signal at the appropriate position of the spectrum analyzer. This is because an actual frequency spectrum analyzer includes multiple stages of frequency mixers and local oscillators in series for converting the frequency of the incoming signal. Thus, the selector 41 selects which one of IF signals at the outputs of the frequency mixers should be used. Therefore, in the case where only one IF signal is fixedly used, the selector 41 is unnecessary.

The divider 42 is to divide the frequency of the selected IF signal by a dividing ratio of M. Since the absolute frequency of the IF signal is known, the dividing ratio M can be determined such that the measurement of the period by the fractional time measurement circuit 44 can be performed easily with high accuracy. In the preferred embodiment, the dividing ration M is set so that the time period at the output of the divider 42 is 8 microsecond or larger, which is a speed suitable for the fractional time measurement circuit 44 to operate with ease.

In general, a time period of an incoming signal is measured by counting the number of reference clock pulses within the time period. However, a fractional time of the time period which is smaller than the cycle of the reference clock pulse cannot be measured by this process. Thus, the fractional time controller 43 and the fractional time measurement circuit 44 are provided to measure the time period of the signal from the divider 42 with higher resolution than the resolution of the reference clock signal. For doing this, the fractional time controller 43 and the fractional time measurement circuit 44 enlarge the fractional times. The more details of the operation of the controller 43 and measurement circuit 44 will be given with reference to the timing chart of FIG. 3.

The first counter 47 counts the number of reference clock during the time period of the signal from the divider 42, i.e., an integer multiple of the reference clock pulse within the time period. The second counter 48 counts the reference clock pulse during the fractional time enlarged by the controller 43 and measurement circuit 44. The first memory 47 stores the resultant data from the first counter 45 and the second memory stores the resultant data from the second counter 46, respectively. The address counter 49 increments the address data for the first and second memories 47 and 48 for storing the data therein or reading the data therefrom.

The process of fractional time measurement is explained in more detail with reference to FIG. 3. Since the IF signal (designated by "gate signal") from the divider 42 having the time period P is asynchronous with the reference clock signal, there arise fractional times ΔT1 and ΔT2 with respect to the start and stop edges of the gate signal. As noted above, the fractional time controller 43 and the fractional time measurement circuit 44 enlarge such fractional times by using, for example, multi-slope integrator circuits (not shown). An example of method for expanding and measuring the fractional times is disclosed in the U.S. Pat. No. 5,629,649 owned by the same assignee of the invention. During each of the expanded fractional times, the number of reference clock pulse is counted by the second counter 46, thereby increasing the resolution of the overall period measurement.

The continuous period measurement block 42 continuously measures the time period of the IF signal at the output of the divider 42. Thus, after measuring the time period P, the next time period P1 starting at the stop edge of the period P is measured in the same manner as measuring the period P. Thus, each and every time period at the output of the divider 42 is continuously measured by the continuous period measurement block 42.

Figure 3:
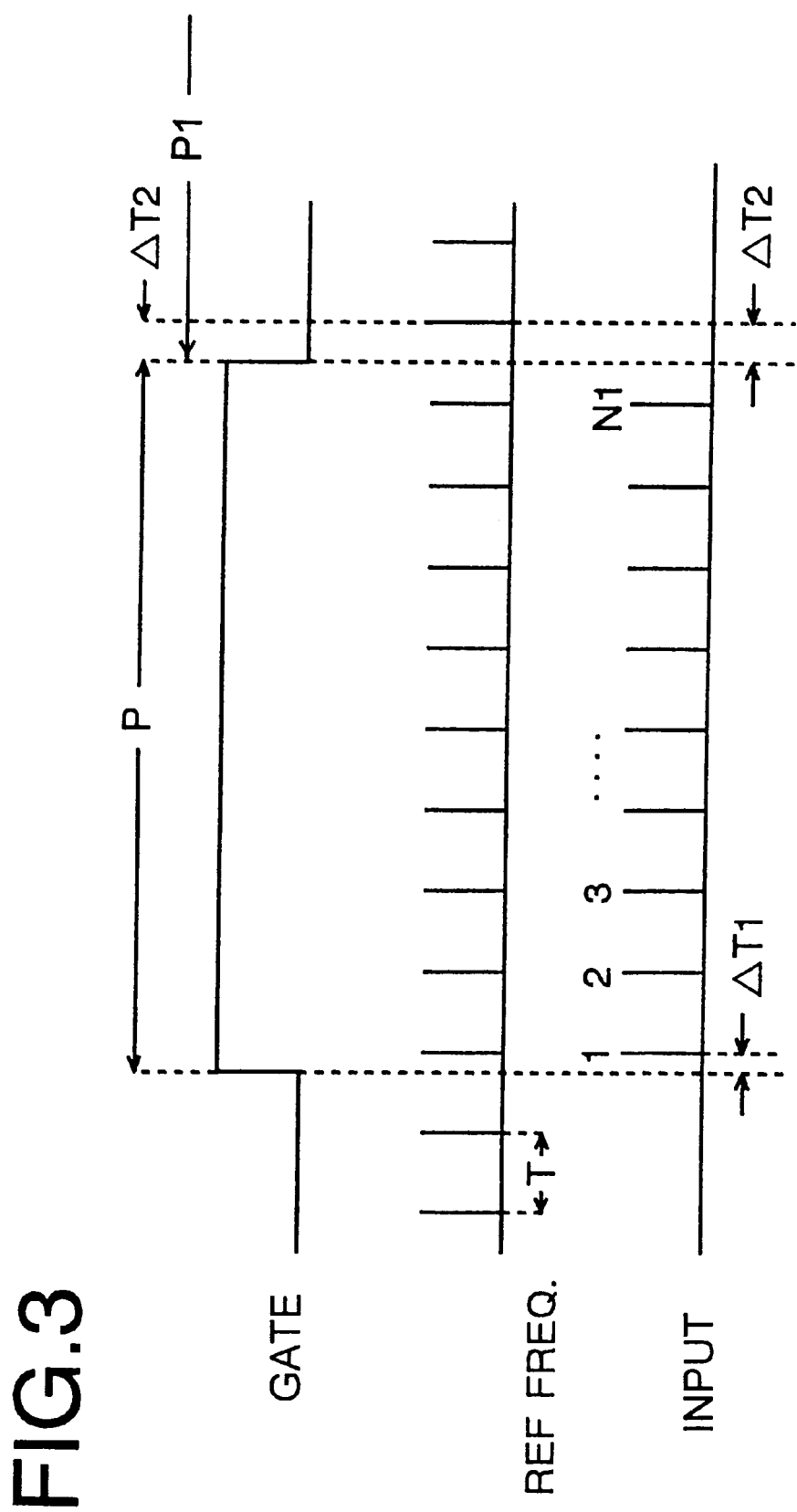
FIG. 3 is a timing chart showing the timing relationship in measuring the time period having fractional times by the continuous period measurement block of FIG. 2.

In the example of FIG. 3, the time period P of the gate signal (IF signal which is frequency divided by the divider 42), the number of clocks N1 in the gate signal and the fractional times ΔT1 and ΔT2 have relationships with one another expressed as follows:

$$P+\Delta T2 = N1 \times T + \Delta T1 \quad (1)$$

$$P = N1 \times T + \Delta T1 - \Delta T2 \quad (2)$$

Since the actual time period P1 of the IF signal is divided by M, the time period P1 of the IF signal is:

$$P1 = (1/M)(N1 \times T + \Delta T1 - T2) \quad (3)$$

Similarly, the next time period P1 of the IF signal is expressed as:

$$P2 = (1/M)(N2 \times T + \Delta T2 - \Delta T3) \quad (4)$$

Similarly, other continuous time periods of the IF signal are expressed as follows:

$$P3 = (1/M)(N3 \times T + \Delta T3 - \Delta T4) \quad (5)$$

$$P4 = (1/M)(N4 \times T + \Delta T4 - \Delta T5) \quad (6)$$

$$Pj = (1/M)(Nj \times T + \Delta Tj - \Delta T(j+1)) \quad (7)$$

The microprocessor 50 calculates each time period of the IF signal based on the foregoing equations. The microprocessor 50 is also able to calculates an instantaneous frequency $F_{IF}$ of the IF signal based on the time period thereof since the frequency is an inverse of the time period as follows:

$$F_{IF} = 1/Pj \quad (8)$$

Further, based on the instantaneous IF frequency, the frequency F1 of the input signal to the frequency spectrum analyzer will be obtained as follows:

$$F1 = F_{LO} \pm F_{IF} = F_{LO} \pm (1/Pj) \quad (9)$$

where, $F_{LO}$ is a frequency of the local oscillator 15. The local frequency $F_{LO}$ is known and the pulse or minus (±) in the equation (9) can be determined by the center frequency of the IF filter 14.

Figure 4:
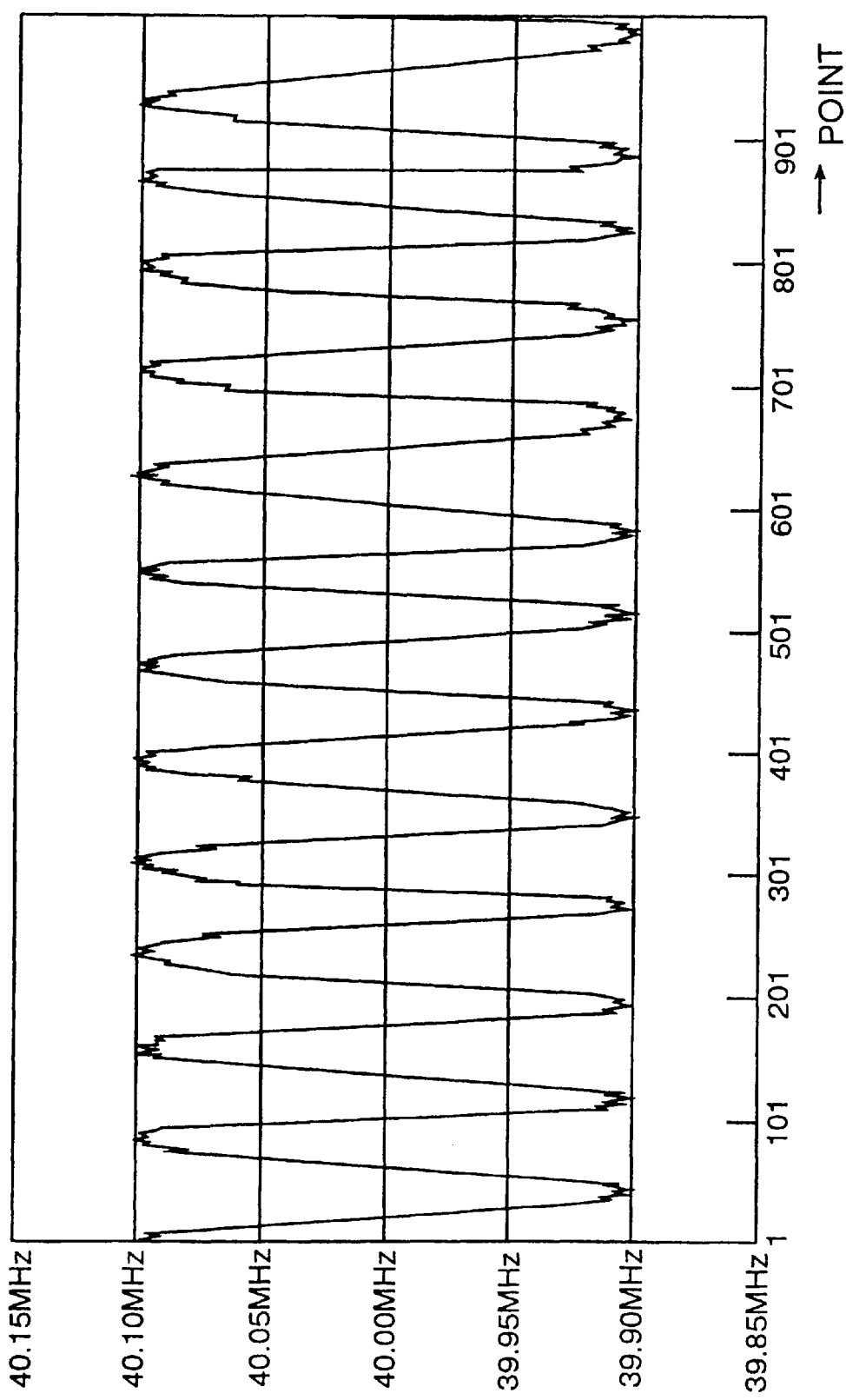
FIG. 4 is a schematic diagram showing an example of graphic display of the time domain measurement results by the spectrum analyzer of the present invention wherein the frequency changes relative to the number of time points is displayed.
Figure 5:
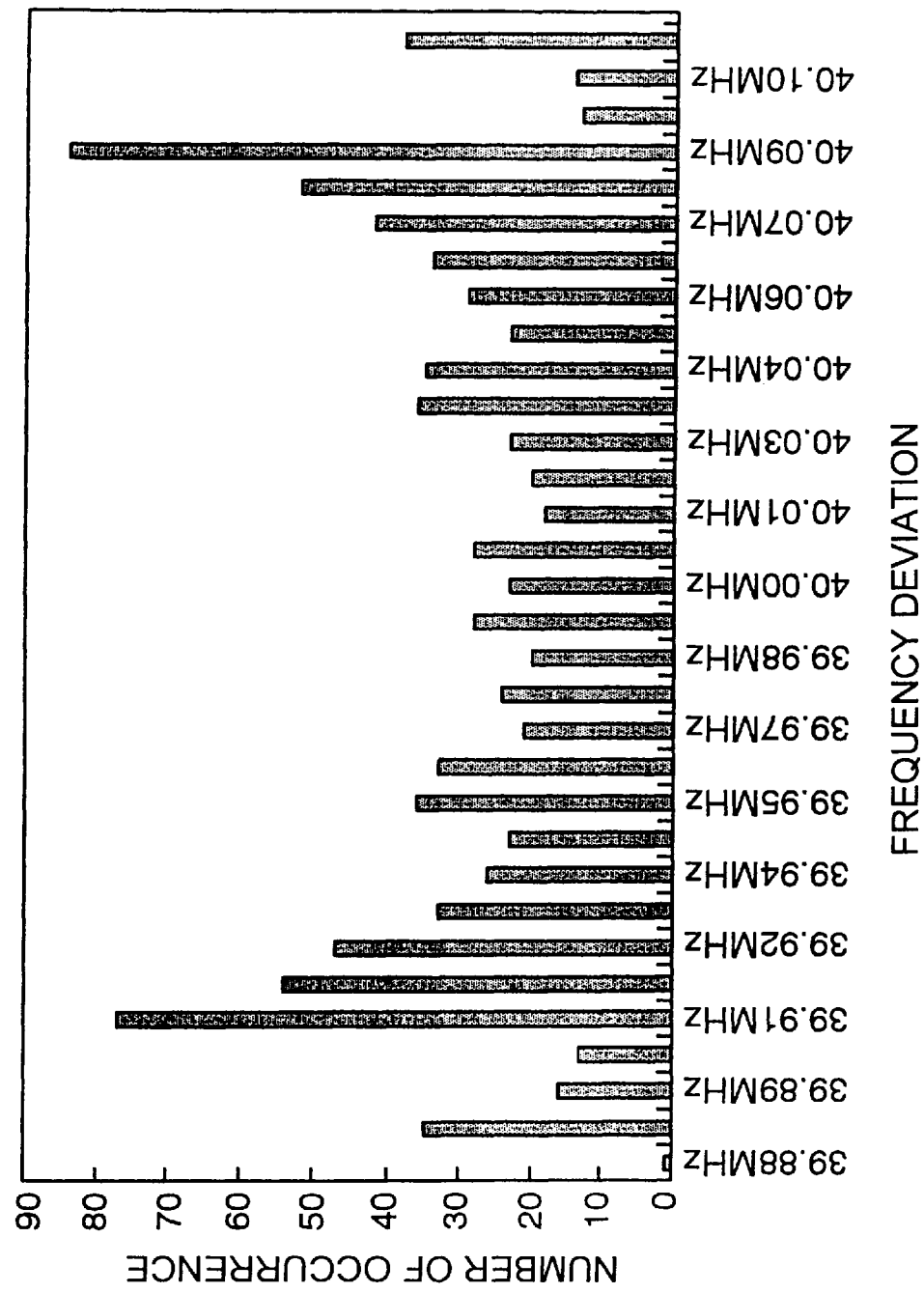
FIG. 5 is a schematic diagram showing another example of graphic display of the time domain measurement results by the spectrum analyzer of the present invention wherein the number of occurrence relative to the corresponding frequency ranges are produced based on the data of FIG. 4.
Figure 6:
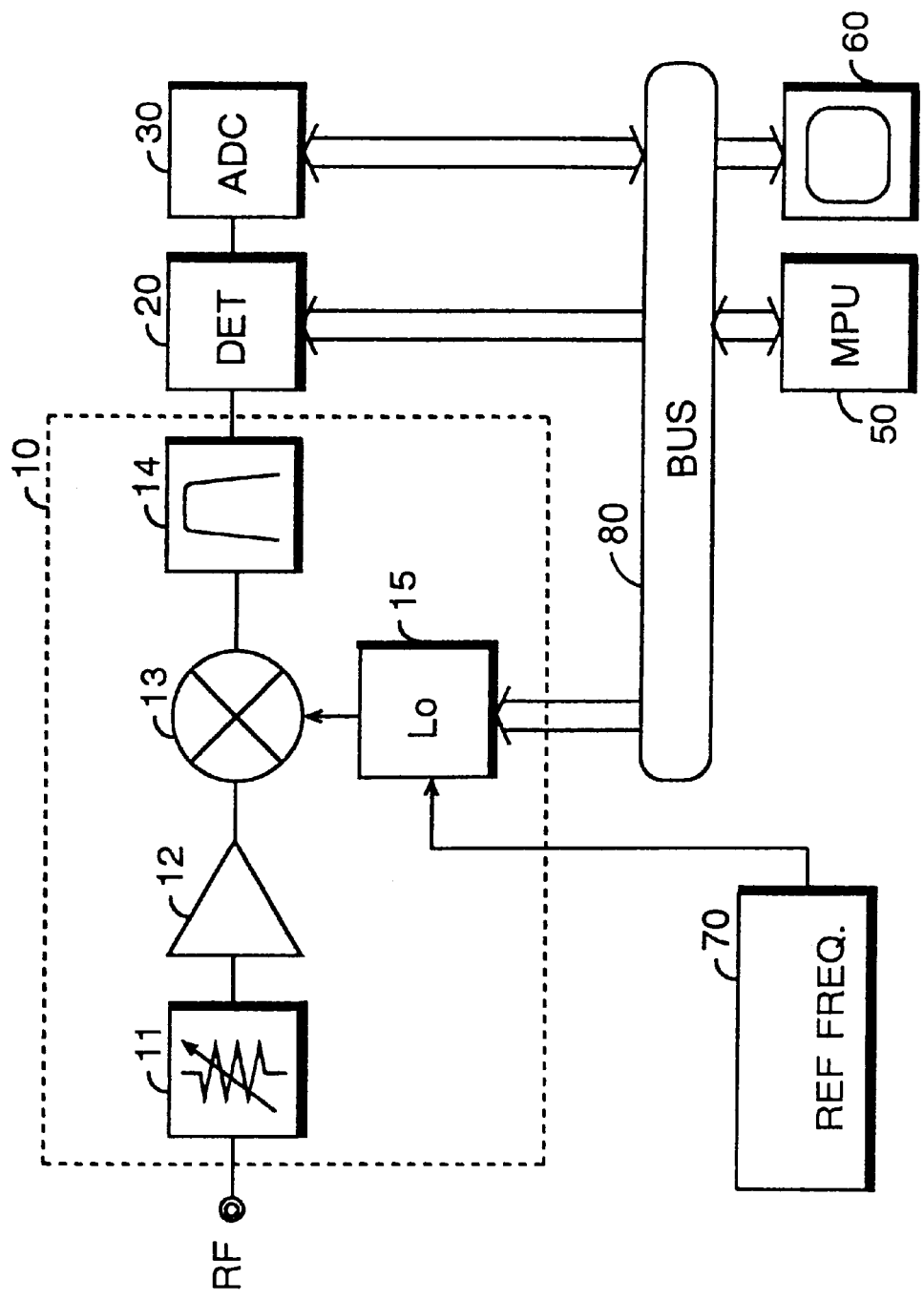
FIG. 6 is a block diagram showing a structure of the conventional frequency spectrum analyzer.

Examples of time domain measurement by the frequency spectrum analyzer of the present invention are shown in FIGS. 4 and 5, respectively. In the example of FIG. 4, an input signal is a frequency modulated (FM) carrier wave of 40 MHz. In the zero span mode (time domain measurement), the frequency change in each point (time period) of the carrier wave is displayed on the monitor screen. Although not shown, in this example, a waveform of frequency change versus time can also be displayed by expressing the time period in the horizontal axis in the time units rather than the number of points.

FIG. 5 is an example of time domain measurement derived from the data of FIG. 4 wherein the horizontal axis shows frequency data points while the vertical axis shows numbers of occurrence. Since the digital data showing each of the continuous periods of the IF signal or input signal can be produced as well as the data showing the corresponding frequency, various types of measurement such as frequency versus time, time versus time, or time versus frequency distribution are easily available. Thus, the vertical and horizontal axes of the display 60 can be used to freely express desired units including power, frequency, time, number of data points and etc.

As described in the foregoing, according to the present invention, the frequency spectrum analyzer is capable of measuring changes in the period or frequency in an input RF signal in the time domain. The frequency spectrum analyzer can measure small and fast changes in the period or frequency in an input RF signal in the time domain with high speed and accuracy. Accordingly, the frequency spectrum analyzer of the present invention can effectively measure settling times in a VCO or PLL circuit or frequency deviation in an FM system in the time domain measurement with high speed and accuracy. Moreover, the frequency spectrum analyzer of the present invention is capable of displaying results of time domain analysis with various dimensions and units including time, frequency, power level, data points and number of occurrence.

Although only a preferred embodiment is specifically illustrated and described herein, it will be appreciated that many modifications and variations of the present invention are possible in light of the above teachings and within the purview of the appended claims without departing the spirit and intended scope of the invention.

What is claimed is:

1. A spectrum analyzer having a sweep local oscillator for analyzing frequency spectrum of an input signal, comprising:

a continuous period measurement block for continuously measuring each time period of an IF (intermediate frequency) signal produced by mixing the input signal and the local oscillator signal; and means for processing the data representing the continuous time period produced by the continuous period measurement block to analyze the input signal in a time domain;

wherein the continuous period measurement block comprising:

a divider for dividing a frequency of the IF signal by a predetermined ratio;

a fractional time measurement circuit for measuring a time length of fractional time produced between an edge of the IF signal and a reference clock pulse by expanding the fractional time;

a fractional time controller for controlling an operation of measuring the fractional time by the fractional time measurement circuit;

a counter for counting the number of reference clock pulse during the time period of the IF signal including the fractional time expanded by the fractional time measurement circuit;

a memory for storing data showing the time period obtained by the counter; and an address counter for generating address data for the memory.

2. A spectrum analyzer as defined in claim 1, wherein the continuous period measurement block further comprising a selector for selecting an IF signal when a plurality of IF signals are incorporated in the spectrum analyzer.

3. A spectrum analyzer having a sweep local oscillator for analyzing frequency spectrum of an input signal, comprising:

a continuous period measurement block for continuously measuring each time period of an IF (intermediate frequency) signal produced by mixing the input signal and the local oscillator signal; and means for processing the data representing the continuous time period produced by the continuous period measurement block to analyze the input signal in a time domain;

wherein the continuous period measurement block comprising:

a divider for dividing a frequency of the IF signal by a predetermined ratio;

a fractional time measurement circuit for measuring a time length of fractional time produced between an edge of the IF signal and a reference clock pulse by expanding the fractional time;

a fractional time controller for controlling an operation of measuring the fractional time by the fractional time measurement circuit;

a first counter for counting the number of reference clock pulse during the time period of the IF signal;

a second counter for counting the number of reference clock pulse during the fractional time expanded by the fractional time measurement circuit;

a first memory for storing data obtained by the first counter;

a second memory for storing data obtained by the second counter; and an address counter for generating address data for the memory.

4. A spectrum analyzer as defined in claim 3, wherein the continuous period measurement block further comprising a selector for selecting an IF signal when a plurality of IF signals are incorporated in the spectrum analyzer.

5. A spectrum analyzer having a sweep local oscillator for analyzing frequency spectrum of an input signal, comprising:

a continuous period measurement block for continuously measuring each time period of an IF (intermediate frequency) signal produced by mixing the input signal and the local oscillator signal; and means for processing the data representing the continuous time period produced by the continuous period measurement block to analyze the input signal in a time domain;

wherein the continuous period measurement block comprising:

a fractional time measurement circuit for measuring a time length of fractional time produced between an edge of the IF signal and a reference clock pulse by expanding the fractional time;

a fractional time controller for controlling an operation of measuring the fractional time by the fractional time measurement circuit; and a counter for counting the number of reference clock pulse during the time period of the IF signal including the fractional time expanded by the fractional time measurement circuit.

6. A spectrum analyzer as defined in claim 5, wherein the continuous period measurement block further comprising:

a divider for dividing a frequency of the IF signal by a predetermined ratio and supplying the frequency divided IF signal to the continuous period measurement block;

a memory for storing data showing the time period of the IF signal obtained by the counter; and an address counter for generating address data for the memory.

7. A spectrum analyzer as defined in claim 5, wherein the continuous period measurement block further comprising a selector for selecting an IF signal when a plurality of IF signals are incorporated in the spectrum analyzer.

* * * * *